(12) United States Patent
Ueda et al.

(10) Patent No.: US 7,871,867 B2
(45) Date of Patent: Jan. 18, 2011

(54) SEMICONDUCTOR DEVICE AND METHOD OF MANUFACTURING THE SAME

(75) Inventors: Naohiro Ueda, Hyogo (JP); Masato Kijima, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 85 days.

(21) Appl. No.: 12/271,042

(22) Filed: Nov. 14, 2008

(65) Prior Publication Data

US 2009/0068811 A1 Mar. 12, 2009

Related U.S. Application Data

(62) Division of application No. 11/360,288, filed on Feb. 22, 2006, now Pat. No. 7,476,947.

(30) Foreign Application Priority Data

Mar. 2, 2005 (JP) ............................. 2005-056850

(51) Int. Cl.
*H01L 21/332* (2006.01)
(52) U.S. Cl. ...................... 438/140; 438/454; 257/340; 257/341
(58) Field of Classification Search ................ 438/140, 438/270, 454; 257/340–341, E29.131, E29.138
See application file for complete search history.

(56) References Cited

U.S. PATENT DOCUMENTS

| 5,770,880 | A | 6/1998 | Woodbury et al. |
| 6,198,131 | B1 | 3/2001 | Tung |
| 6,963,109 | B2 | 11/2005 | Kikuchi et al. |
| 7,087,961 | B2 * | 8/2006 | Kikuchi et al. ............... 257/341 |

FOREIGN PATENT DOCUMENTS

| JP | 6-21445 | 1/1994 |
| JP | 2668713 | 7/1997 |

* cited by examiner

*Primary Examiner*—Theresa T Doan
(74) *Attorney, Agent, or Firm*—Cooper & Dunham LLP

(57) ABSTRACT

A semiconductor device is disclosed that comprises a high breakdown voltage MOSFET. The MOSFET includes a source region of a second conductivity type and a drain region of the second conductivity type formed apart from each other in a well region of a first conductivity type, a channel region formed between the source region and the drain region, a gate insulation film formed on the channel region, a LOCOS oxide film having greater film thickness than the gate insulation film, and a gate electrode formed across the gate insulation film and the LOCOS oxide film.

11 Claims, 12 Drawing Sheets mask misalignment distance (μm)
(negative side: source side, positive side: drain side)

SEMICONDUCTOR DEVICE AND METHOD OF MANUFACTURING THE SAME

CROSS-REFERENCE TO RELATED APPLICATION

This application is a divisional of U.S. Ser. No. 11/360,288, filed Feb. 22, 2006, now U.S. Pat. No. 7,476,947 the entire contents of which are incorporated herein by reference.

BACKGROUND

1. Technical Field

This disclosure generally relates to a semiconductor, device and a method of manufacturing the same, and particularly relates to a semiconductor device having a high breakdown voltage MOSFET (Metal Oxide Semiconductor Field Effect Transistor) and a method of manufacturing the same.

2. Description of the Related Art

For example, semiconductor integrated circuits having charge control functions for mobile phones are usually driven at a voltage of 5-6 V (volts), and the rated voltage thereof is about 8 V. If the semiconductor integrated circuits are connected to a defective adapter, a voltage higher than the rated voltage, e.g. 12 V-18V, might be applied to internal circuits. It is therefore desirable that the internal circuits be able to operate normally without having any problems; such as heat generation and failure, even when encountering such a situation.

Display system devices such as liquid crystal display devices are also required to operate in a high voltage band of about 15 V and at high current. That is, transistors having higher breakdown voltage and operable at higher current support the recent developments of mobile phones and digital communication drives.

There are various methods of increasing the rated voltage of MOSFETs. One method is to provide a thick oxide film under a gate oxide film at the drain side, and a second drain region under the thick oxide film. This type of MOSFET having the thick oxide film made of a LOCOS (local oxidation of silicon) oxide film for element separation is called a LOCOS offset transistor.

In manufacture of such a LOCOS offset transistor, increasing the rated voltage goes against improvement of drive performance. This is because if impurity concentration of the second drain region is increased, electric field concentration in the vicinity of the gate insulation film is significantly increased, which results in reduction of the breakdown voltage between the drain and a semiconductor substrate. In addition, expansion of a depletion layer between the second drain region and the semiconductor substrate is prevented, which also results in reduction of the breakdown voltage between the drain and the semiconductor substrate. On the other hand, if the impurity concentration of the second drain region is reduced, parasitic resistance of the drain is increased, which lowers drive performance. That is, the configuration of the second drain region is a key to balance the breakdown voltage and the drive performance at higher levels.

FIG. 15 shows a first related art MOSFET (see, for example, Patent Document 1). In this MOSFET, a P+ drain region 86 of medium concentration and a P- drain region 88 of low concentration are formed between a P++ drain region 82 and a gate oxide film 84 disposed on the surface of an N-type semiconductor substrate 80. The P+ drain region 86 is formed under a thick LOCOS oxide film 90, whereas the P- drain region 88 is disposed under the gate oxide film 84.

A problem with the configuration of FIG. 15 is that the P++ drain region 82 is in direct contact with the N-type semiconductor substrate 80, which prevents expansion of a depletion layer and therefore might cause junction destruction at low voltage. Patent Document 1 also discloses a configuration in which a P- drain region is disposed under the P++ drain region 82. Even with this configuration, as the P+ drain region 86 is in direct contact with the N-type semiconductor substrate 80, the breakdown voltage cannot be sufficiently increased for the same reason.

Another problem with the MOSFET disclosed in Patent Document 1 is that because the P- drain region 88 is formed in contact with the gate oxide film 84 after the LOCOS oxide film 90 is formed, reduction of the electric field in the vicinity of a region where the P- drain region 88 is in contact with the gate oxide film 84 is prevented, which limits the expansion of the depletion layer and therefore causes gate modulation junction destruction at low drain voltage.

FIG. 16 shows a second related art MOSFET (see, for example, Patent Document 2). In this MOSFET, a thick LOCOS oxide film 90 is formed at a channel region side of a first drain region 92 of high impurity concentration, and a shallow second drain region 94 of high impurity concentration is formed directly under the LOCOS oxide film 90. Further, a deep third drain region 96 of low impurity concentration is formed to surround the second drain region 94.

A problem with this MOSFET is that because impurities for the shallow second drain region 94 are introduced directly under a region where the LOCOS oxide film 90 is to be formed before forming the LOCOS oxide film 90, the MOSFET is easily affected by ion attraction into the LOCOS oxide film 90 and ion segregation at the interface between the LOCOS oxide film 90 and a semiconductor substrate 80, which makes the drive performance susceptible to process changes.

Another problem with this MOSFET is that because the shallow second drain region 94 of high concentration is formed in the vicinity of a gate oxide film 84, the strength of the electric field between the gate and the drain is increased, which results in reduction of the breakdown voltage of the gate oxide film 84.

Moreover, because the first drain region 92 of high concentration is in direct contact with the P-type semiconductor substrate 80, expansion of a depletion layer is prevented, which causes junction destruction at low drain voltage.

<Patent Document 1> Japanese Patent Laid-Open Publication No. 6-21445

<Patent Document 2> Japanese Patent Registration No. 2668713

BRIEF SUMMARY

In an aspect of this disclosure, there are provided a semiconductor device having a high breakdown voltage MOSFET with high drive performance and high breakdown voltage, and a method of manufacturing the same.

According to another aspect, there is provided a semiconductor device that comprises a high breakdown voltage MOSFET. The MOSFET includes a source region of a second conductivity type and a drain region of the second conductivity type formed apart from each other in a well region of a first conductivity type, a channel region formed between the source region and the drain region, a gate insulation film formed on the channel region, a LOCOS oxide film having a film thickness greater than the gate insulation film and formed adjacent to the gate insulation film, and a gate electrode formed across the gate insulation film and the LOCOS oxide film, wherein the drain region includes a first drain region formed apart from the gate electrode, a second drain region covering the first drain region and formed in a region including at least a region under the LOCOS oxide film, and a third drain region covered with the second drain region at least at a lower part thereof and formed in a region including at least the region under the LOCOS oxide film, and wherein the first drain region has a higher concentration of impurities of the second conductivity type than the third drain region, and the third drain region has a higher concentration of impurities of the second conductivity type than the second drain region.

In the above-described semiconductor device, since the first drain region having higher impurity concentration is covered with the second drain region having lower impurity concentration, the breakdown voltage of the MOSFET can be increased. Since the third drain region having a higher impurity concentration than the second drain region is disposed under the LOCOS oxide film, resistance of the drain region can be reduced. Accordingly, the drain current can be increased. Thus, the drive performance and the breakdown voltage of the high breakdown voltage MOSFET can be increased.

According to another aspect, there is provided a semiconductor device that comprises a constant voltage generator circuit. The constant voltage generator circuit includes an output river to control output of an input voltage, a dividing resistor circuit to divide the output voltage to supply a divided voltage, a reference voltage generator circuit to supply a reference voltage, and a comparator circuit to compare the divided voltage from the dividing resistor circuit and the reference voltage from the reference voltage generator circuit so as to control operations of the output driver according to a comparison result, wherein the output driver is the above-described high breakdown voltage MOSFET.

According to another aspect, there is provided a method of manufacturing a semiconductor device that comprises a step of forming a well region of a first conductivity type in a semiconductor substrate, a step of forming a second drain region by ion-implanting impurities of a second conductivity type into a predetermined region of the well region, a step of forming a LOCOS oxide film at least in a predetermined region of a surface of the second drain region, a step of forming a third drain region covered with the second drain region at least at a lower part thereof by ion-implanting impurities of the second conductivity type into a region including a region under the LOCOS oxide film, a step of forming a gate insulation film adjacent to the LOCOS oxide film on a surface of the well region, a step of forming a gate electrode across the gate insulation film and the LOCOS oxide film, and a step of forming a source region and a first drain region in the well region and the second drain region, respectively, by ion-implanting impurities of the second conductivity type while using the gate electrode and the LOCOS oxide film as masks.

With this method, the above-described semiconductor device comprising the high breakdown voltage MOSFET can be manufactured.

DETAILED DESCRIPTION OF THE PREFERRED EMBODIMENT

Figure 1:
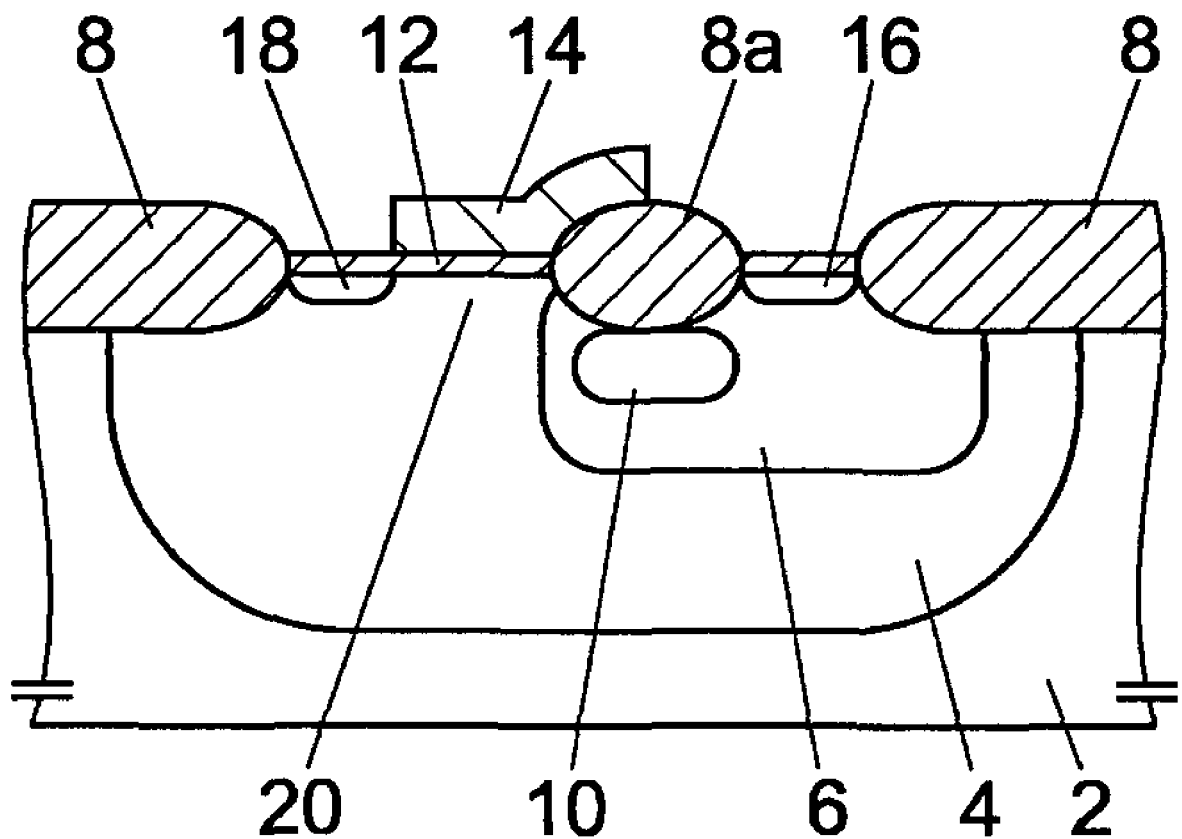
FIG. 1 is a schematic cross-sectional view showing a semiconductor device according to one embodiment.
Figure 2:
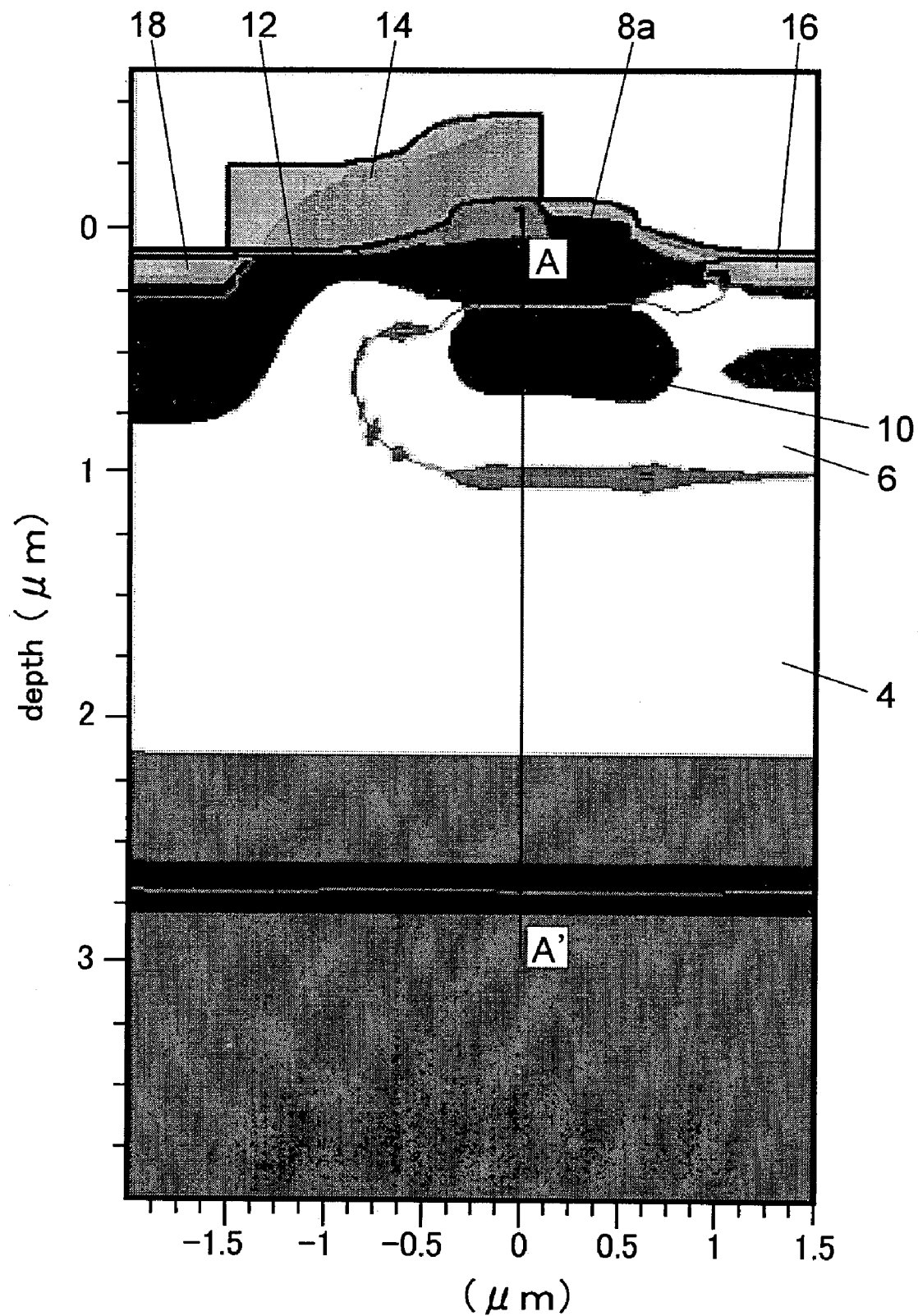
FIG. 2 is a schematic cross-sectional view showing a simulation result of impurity concentration distribution according to the above embodiment.
Figure 3:
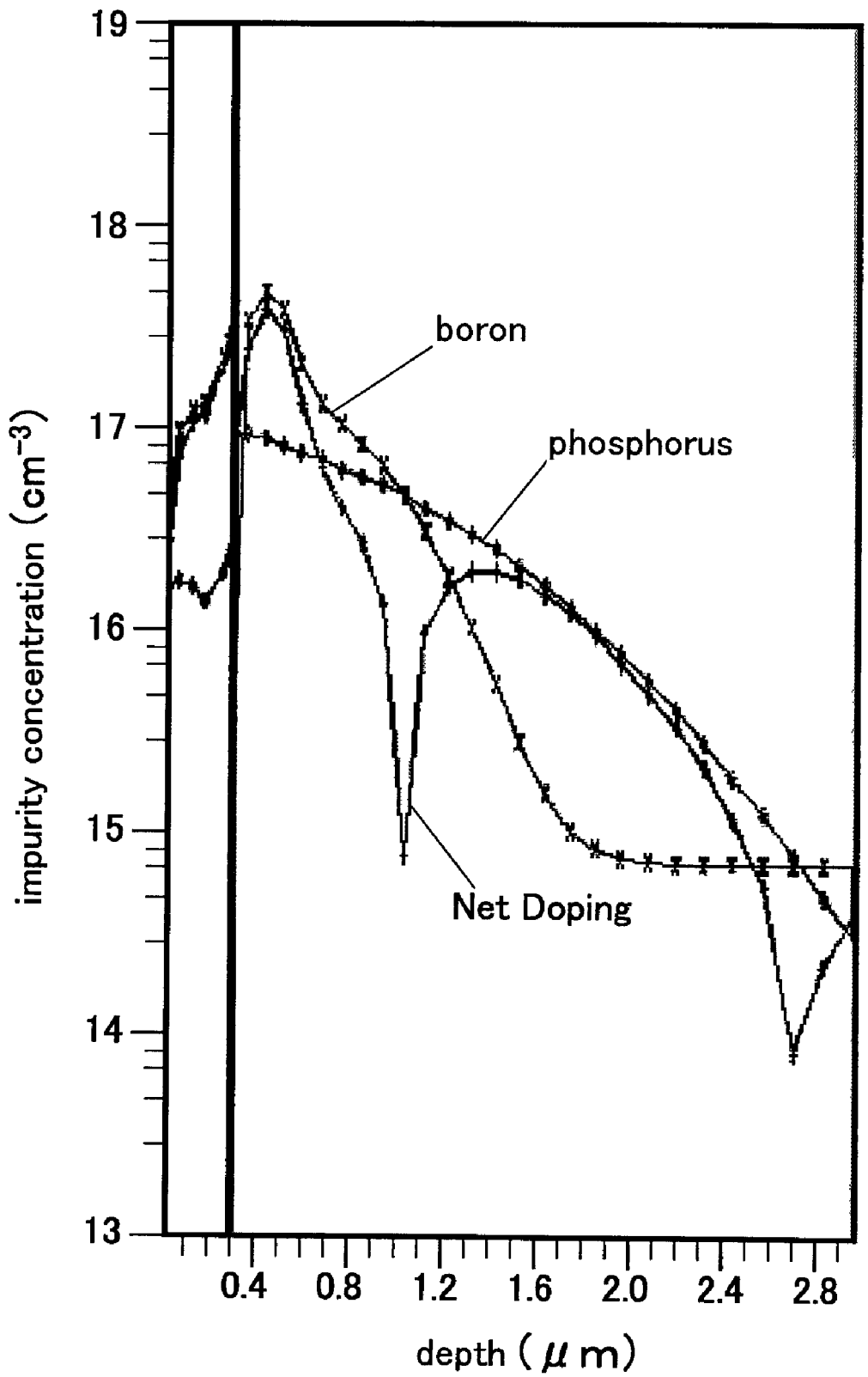
FIG. 3 graphs an impurity concentration profile in a depth direction in a position A-A' of FIG. 2.
Figure 4A:
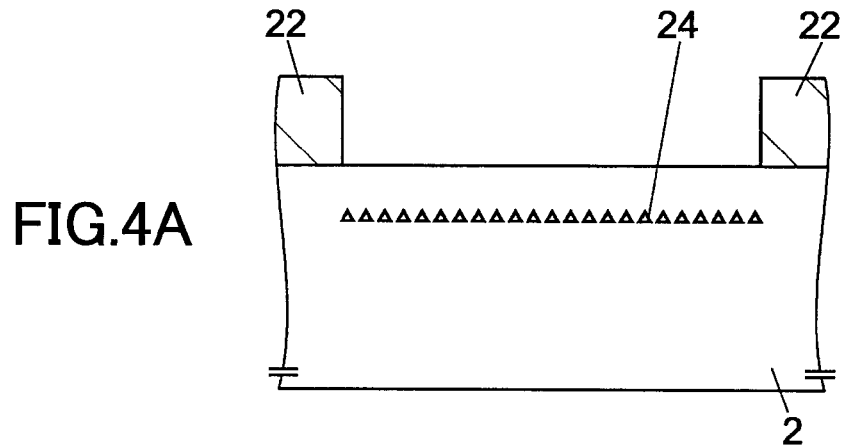
FIGS. 4A-4D and FIGS. 5A-5D are cross-sectional views illustrating a process of a manufacturing method according to one embodiment.
Figure 4B:
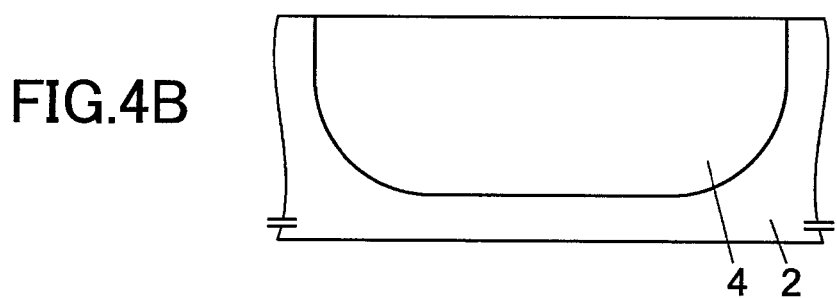
Figure 4C:
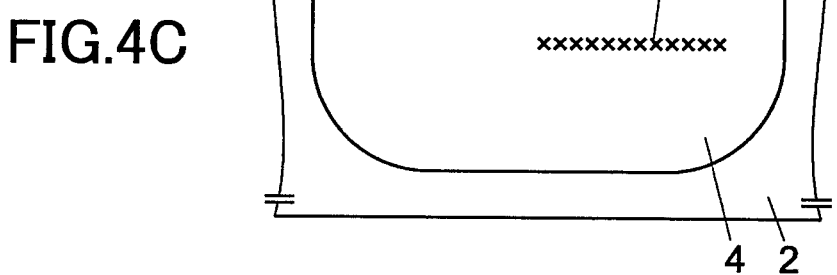
Figure 4D:
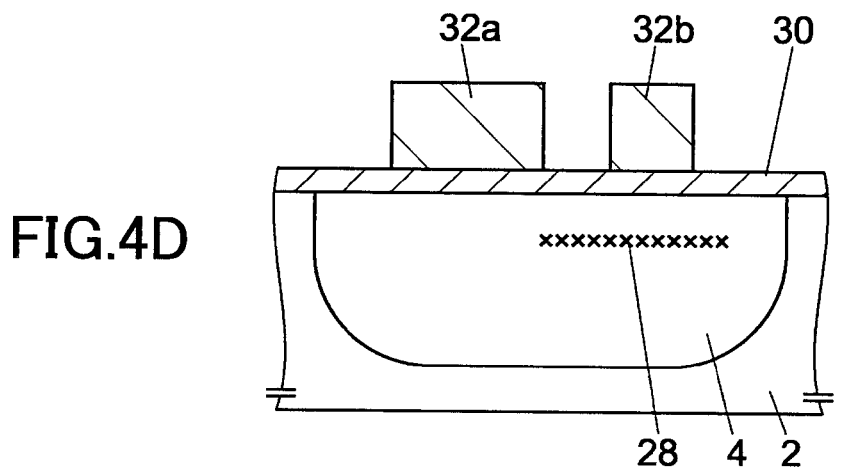

FIG. 1 is a schematic cross-sectional view showing a semiconductor device according to one embodiment. FIG. 2 is a schematic cross-sectional view showing a simulation result of impurity concentration distribution according to this embodiment. FIG. 3 shows an impurity concentration profile in a depth direction in a position A-A' of FIG. 2. The following describes this embodiment with reference to FIGS. 1-3.

An N-type well region 4 is formed in a P-type semiconductor substrate 2. A P-type second drain region 6 is formed in the N-type well region 4.

LOCOS oxide films 8 and 8a are formed on the surface of the P-type semiconductor substrate 2 near the periphery of the N-type well region 4 and near the periphery of the P-type second drain region 6. The LOCOS oxide film formed near an end of the P-type second drain region 6 bears the reference number 8a.

A P-type third drain region 10 having a higher P-type impurity concentration than the P-type second drain region 6 is formed under the LOCOS oxide film 8a inside the P-type second drain region 6.

A gate oxide film (gate insulation film) 12 is formed adjacent to the LOCOS oxide film 8a on the surface of the N-type well region 4. A gate electrode 14 is formed across the gate oxide film 12 and the LOCOS oxide film 8a.

The P-type second drain region 6 is spaced apart from the gate oxide film 12. The plan position of a source region side end of the P-type second drain region 6 is generally aligned with the position of the boundary between the gate oxide film 12 and the LOCOS oxide film 8a.

A P-type first drain region 16 is formed apart from the gate electrode 14 in the vicinity of the surface of the P-type second drain region 6. The P-type first drain region 16 has a higher P-type impurity concentration than the P-type second drain region 6 and the P-type third drain region 10.

In this embodiment, the P-type first drain region 16, the P-type second drain region 6, and the P-type third drain region 10 form a drain region of a high breakdown voltage MOSFET.

A P-type source region 18 is formed adjacent to or overlapping the side surface of the gate electrode 14 opposite to the P-type first drain region 16 (in plan view) in the vicinity of the surface of the N-type well region 4. The P-type source region 18 and the P-type second drain region 6 are spaced apart. A region in the vicinity of the surface of the N-type well region 4 between the P-type source region 18 and the P-type second drain region 6 forms a channel region 20.

In this embodiment, since the P-type first drain region 16 of high concentration is covered with the P-type second drain region 6, the breakdown voltage can be increased. Since the P-type third drain region 10 having a higher concentration than the P-type second drain region 6 is disposed under the LOCOS oxide film 8a, the resistance of the drain region is reduced. Accordingly, the drain current can be increased.

Since the P-type third drain region 10 is completely covered with the P-type second drain region 6, the P-type third drain region 10 having a higher P-type impurity concentration than the P-type second drain region 6 does not have any surface in contact with the N-type well region 4. Accordingly, the drain junction breakdown voltage can be increased.

Since the P-type second drain region 6 is spaced apart from the gate insulation film 12, concentration of electric field in the vicinity of the gate insulation film 12 is reduced. Thus, the drain junction breakdown voltage can be increased.

Figure 5A:
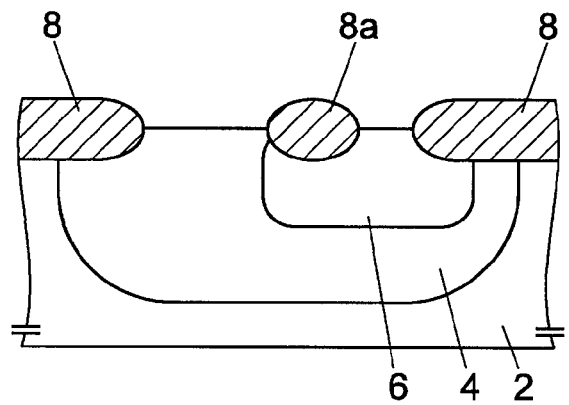
Figure 5B:
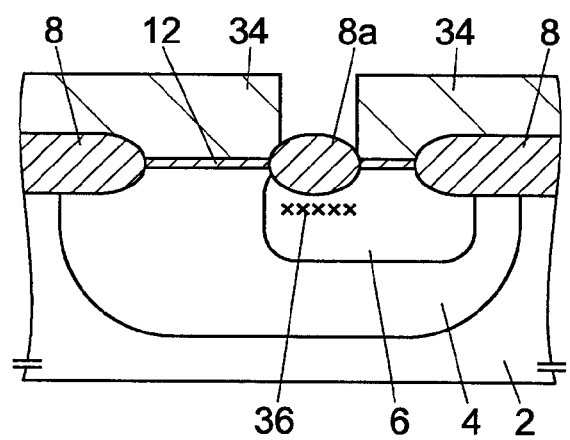
Figure 5C:
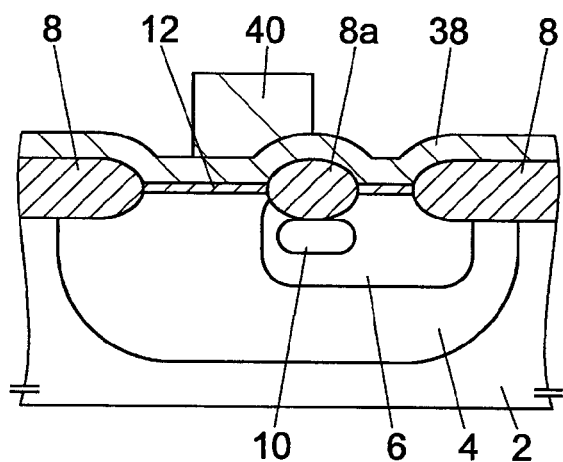
Figure 5D:
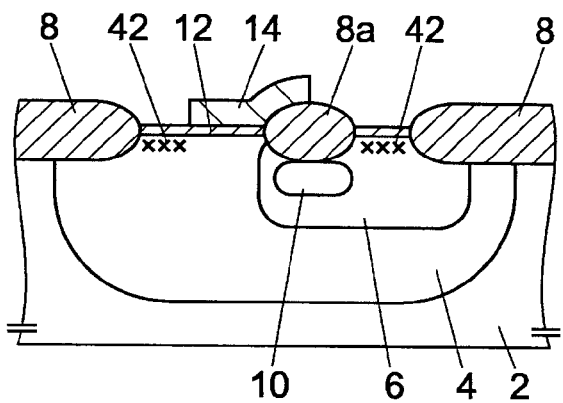
Figure 6:
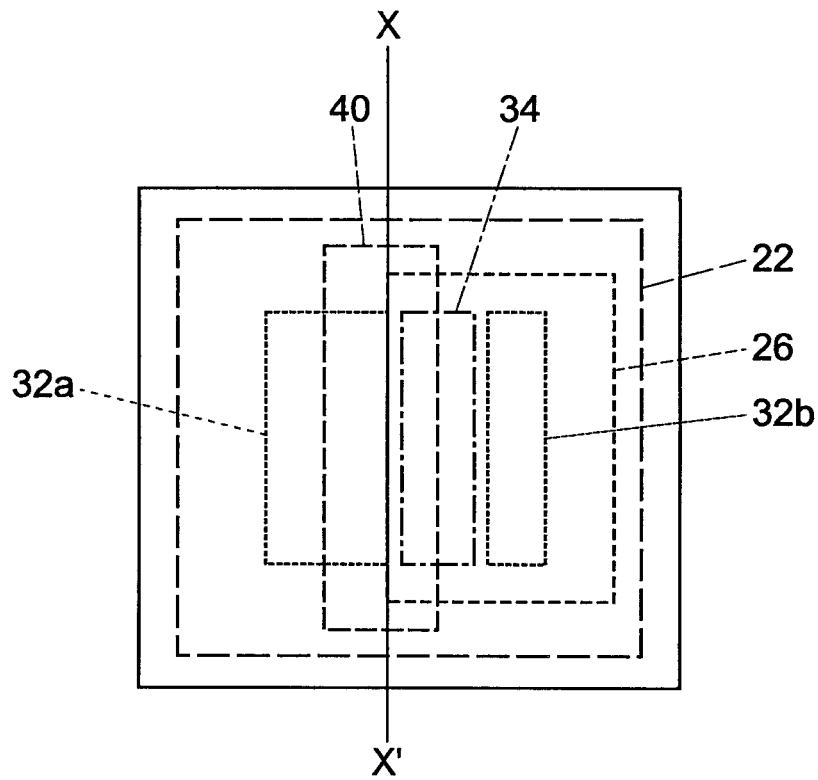
FIG. 6 is a plan view illustrating opening areas of resist patterns used in the above embodiment.

FIGS. 4A-4D and FIGS. 5A-5D are cross-sectional views illustrating a process of a manufacturing method according to one embodiment. FIG. 6 is a plan view illustrating opening areas of resist patterns used in this embodiment. The following describes this embodiment with reference to FIG. 1 and FIGS. 4A-6.

(1) A resist pattern 22 is formed on the P-type semiconductor substrate 2 by a photoengraving process so as to define the region where the N-type well region 4 is to be formed. Phosphorous 24 as an N-type impurity, for example, is ion-implanted at an acceleration energy of 160 KeV with a dose of $1\times10^{13}$ cm$^{-2}$ while using the resist pattern 22 as a mask (see FIG. 4A and FIG. 6).

(2) After removing the resist pattern 22, a heat treatment is performed, for example, at a temperature of 1150° C. in a nitrogen atmosphere for two hours such that the implanted phosphorous 24 is diffused and activated. Thus, the N-type well region 4 is formed (see FIG. 4B).

(3) A second drain region resist pattern 26 is formed on the P-type semiconductor substrate 2 by a photoengraving process so as to define the region where the second drain region 6 is to be formed. Boron 28 as a P-type impurity, for example, is ion-implanted at an acceleration energy of 160 KeV with a dose of $1\times10^{13}$ cm$^{-2}$ while using the second drain region resist pattern 26 as a mask (see FIG. 4C and FIG. 6).

After removing the second drain region resist pattern 26, a silicon film 30 is formed on the entire surface of the P-type semiconductor substrate 2. (4) LOCOS oxide film resist patterns 32a and 32b are formed by a photoengraving process so as to define the regions where the LOCOS oxide films 8 and 8a are to be formed (see FIG. 4D and FIG. 6). The plan position of the edge of the LOCOS oxide film resist pattern 32a for defining a source side end of the LOCOS oxide film 8a is aligned with the plan position of the edge of the second drain region resist pattern 26 used in the above step (3) for defining the source region side end of the second drain region 6 (see a position X-X' of FIG. 6).

(5) After the silicon film 30 is patterned by etching while using the LOCOS oxide film resist patterns 32a and 32b as masks, the LOCOS oxide film resist patterns 32a and 32b are removed. A heat treatment is performed, for example, at a temperature of 1000° C. in an oxidizing atmosphere for one hour so as to form the LOCOS oxide films 8 and 8a. The boron 28 implanted in the above step (3) is diffused and activated due to this heat treatment, so that the P-type second drain region 6 is formed (see FIG. 5A).

Then, the silicon film 30 is removed.

Although the diffusion and activation of the boron 28 are performed simultaneously with the formation of the LOCOS oxide films 8 and 8a in this embodiment, this disclosure is not limited thereto. In an alternative embodiment, a heat treatment process dedicated to the diffusion and activation of the boron 28 may be separately provided.

(6) A resist pattern 34 is formed by a photoengraving process so as to define the region where the third drain region 10 is to be formed. Boron 36 as a P-type impurity, for example, is ion-implanted at an acceleration energy of 180 KeV with a dose of $1\times10^3$ cm$^{-2}$ while using the resist pattern 34 as a mask (see FIG. 5B and FIG. 6).

(7) The resist pattern 34 is removed, and then an oxide film on the surface of the P-type semiconductor substrate 2 except the regions where the LOCOS oxide films 8 and 8a are formed is removed. After that, a heat treatment is performed in an oxygen atmosphere so as to form the gate oxide film 12. The boron 36 implanted in the above step (6) is diffused and activated due to this heat treatment, so that the P-type third drain region 10 is formed. The plan position of the source region side end of the P-type second drain region 6 is generally aligned with the position of the boundary between the gate oxide film 12 and the LOCOS oxide film 8a.

A polysilicon film 38 is formed on the entire surface of the P-type semiconductor substrate 2. Then, a resist pattern 40 for defining the region where the gate electrode 14 is to be formed is formed on the polysilicon film 38 by a photoengraving process (FIGS. 5C and 6).

(8) The polysilicon film 38 is patterned by etching while using the resist pattern 40 as a mask, so that the gate electrode 14 is formed. After that, the resist pattern 40 is removed. BF$_2$ (boron difluoride) 42, for example, is ion-implanted at an acceleration energy of 30 KeV with a dose of $3\times10^{15}$ cm$^{-2}$ while using the LOCOS oxide films 8 and 8a and the gate electrode 14 as masks (see FIG. 5D).

(9) A heat treatment is performed, for example, at a temperature of 850° C. in a nitrogen atmosphere for 30 minutes so as to diffuse and activate the implanted BF$_2$ 42. Thus, the P-type first drain region 16 is formed apart from the gate electrode 14 in the P-type second drain region 6. At the same time, the P-type source region 18 is formed adjacent to or overlapping the gate electrode 14 (in plan view) (see FIG. 1).

In this embodiment, an opening of the second drain region resist pattern 26 is formed over the region where the LOCOS oxide film resist pattern 32b, which corresponds to the region where the P-type first drain region 16 is to be formed, is to be formed. Accordingly, the P-type first drain region 16 is covered with the P-type second drain region 6 of low concentration, thereby increasing the breakdown voltage of the high breakdown voltage MOSFET.

The plan position of the edge of the second drain region resist pattern 26 for defining the source region side end of the second drain region 6 is aligned with the plan position of the edge of the LOCOS oxide film resist pattern 32a for defining the source side end of the LOCOS oxide film 8a (see a position X-X' of FIG. 6). Accordingly, the plan position of the source region end of the second drain region 6 is generally aligned with the position of the boundary between the gate oxide film 12 and the LOCOS oxide film 8a. It is therefore possible to maximize the drive performance by maximizing the drain saturation current of the high breakdown voltage MOSFET, and to increase the breakdown voltage at the same time.

Figure 7:
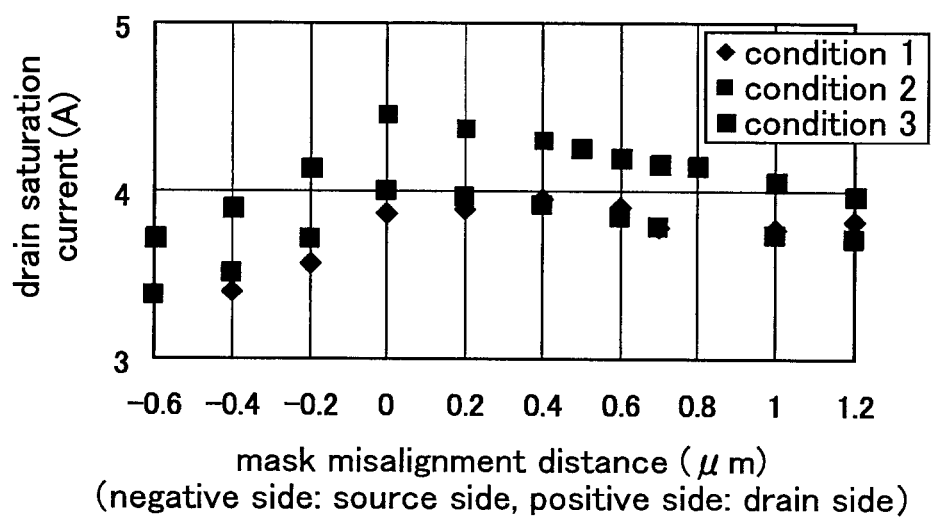
FIG. 7 graphs an evaluation result of drain saturation current relative to the mask misalignment distance between an edge of a second drain region resist pattern and an edge of a LOCOS oxide film resist pattern.
Figure 8:
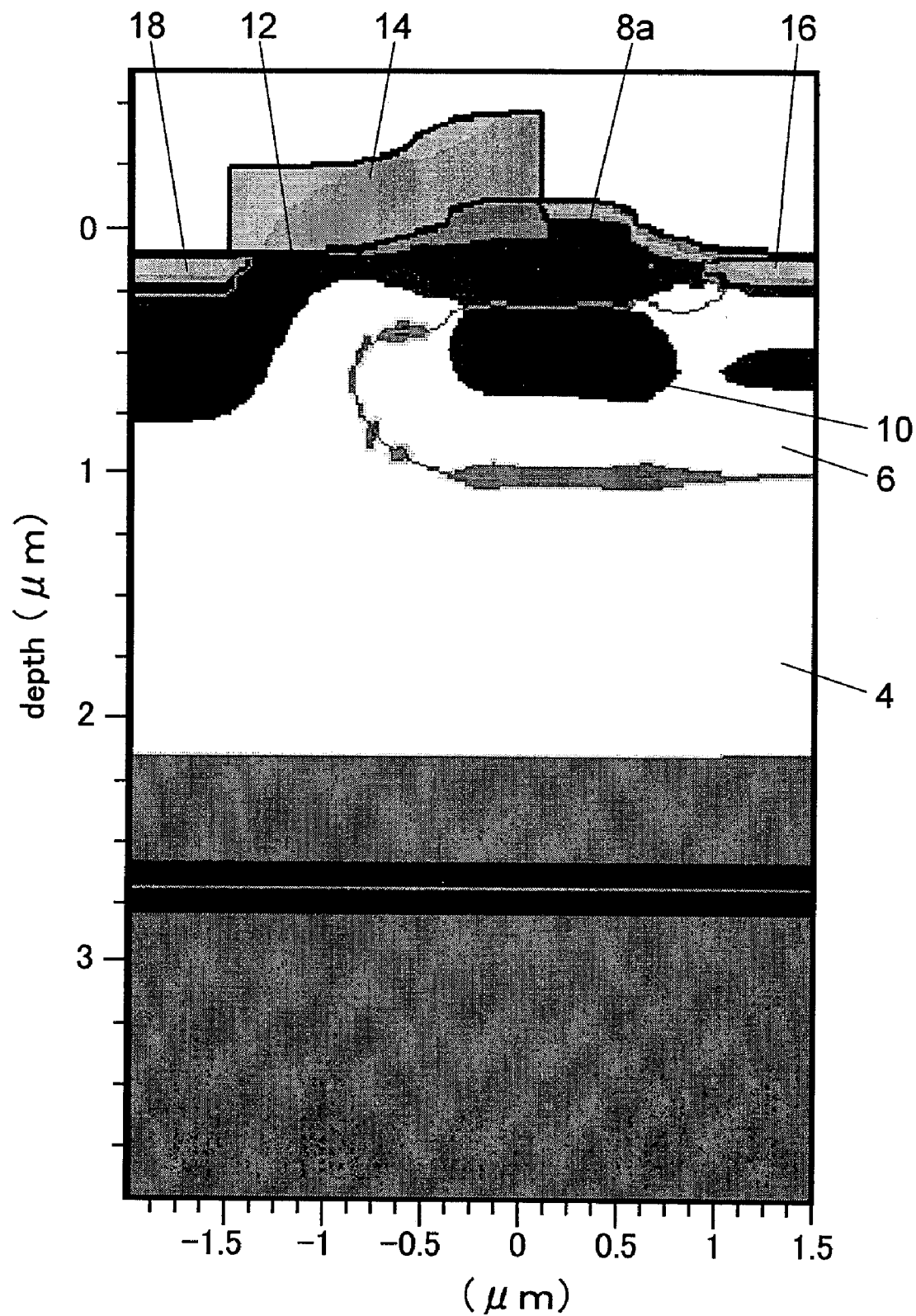
FIG. 8 is a cross-sectional view showing a result of simulation of impurity concentration distribution of a MOSFET as one embodiment, using a sample 1 prepared in the evaluation of FIG. 7.
Figure 9:
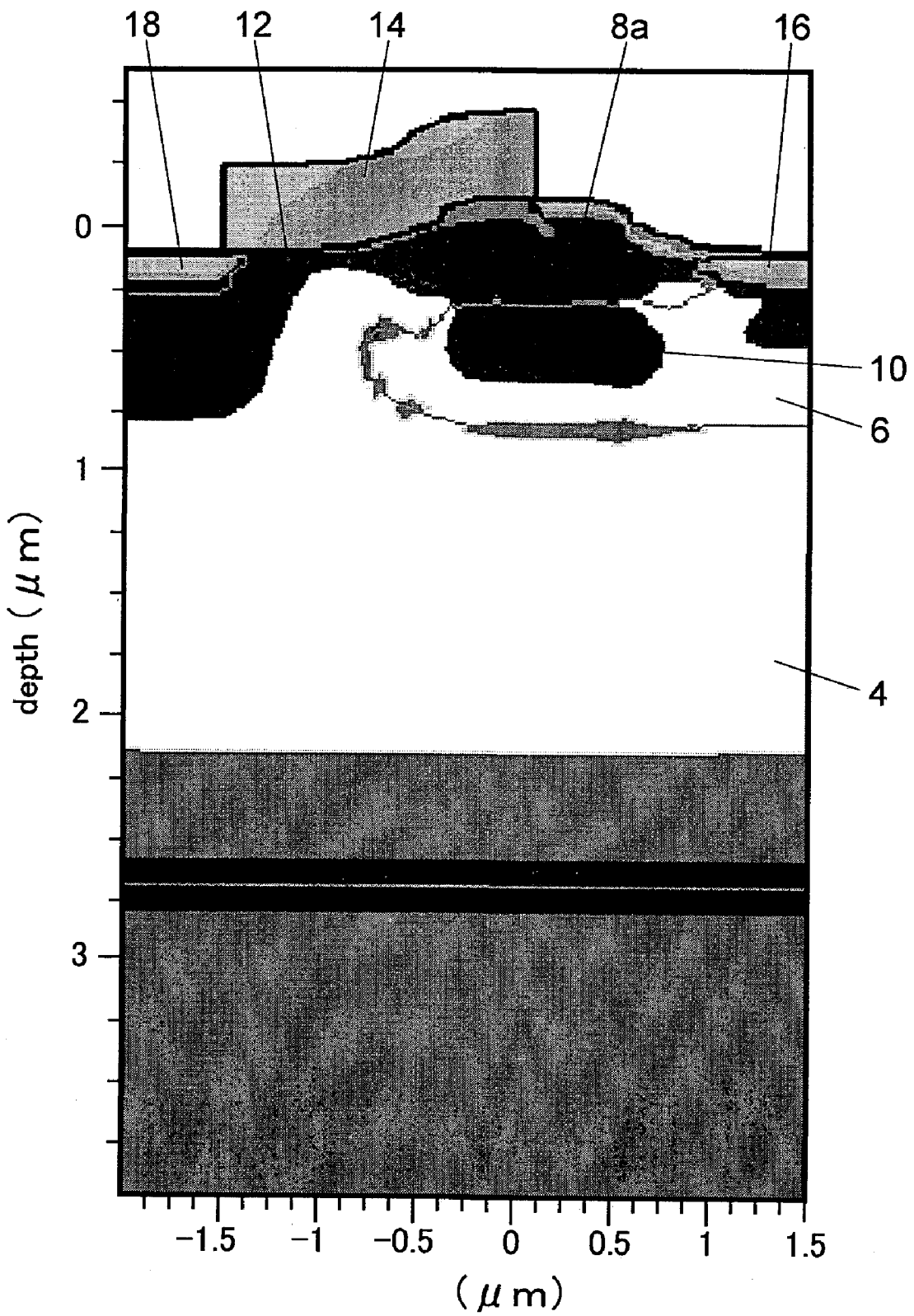
FIG. 9 is a cross-sectional view showing a result of simulation of impurity concentration distribution of a MOSFET as one embodiment, using a sample 2 prepared in the evaluation of FIG. 7.
Figure 10:
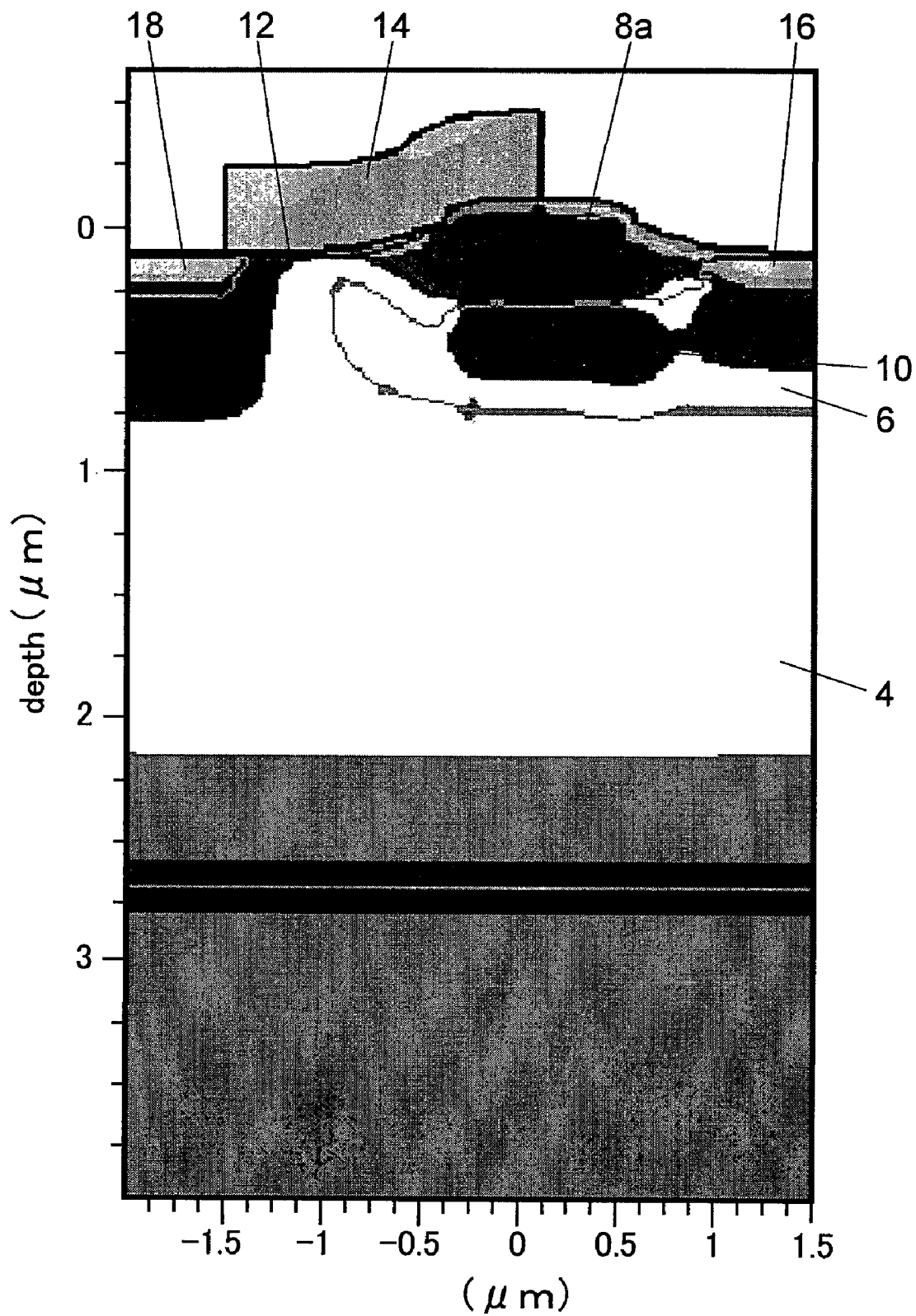
FIG. 10 is a cross-sectional view showing a result of simulation of impurity concentration distribution of a MOSFET as one embodiment, using a sample 3 prepared in the evaluation of FIG. 7.

FIG. 7 shows an evaluation result of the drain saturation current relative to the mask misalignment distance between the edge of the second drain region resist pattern 26 and the edge of the LOCOS oxide film resist pattern 32a. The vertical axis indicates the drain saturation current (A (amperes)), while the horizontal axis indicates the mask misalignment distance (μm). There were prepared samples 1-3. Conditions of the ion implantation for the second drain region 6 were an acceleration energy of 160 KeV and a dose of $1 \times 10^{13}$ cm$^{-2}$ for the sample 1, an acceleration energy of 100 KeV and a dose of $1 \times 10^{13}$ cm$^{-2}$ for the sample 2, and an acceleration energy 50 KeV and a dose of $1.6 \times 10^{13}$ cm$^{-2}$ for the sample 3. The same conditions as those applied to the manufacturing method of the above embodiment were applied to other processes of manufacturing the samples 1-3. FIGS. 8, 9, and 10 show the simulation results of the impurity concentration distribution of the samples 1, 2, and 3, respectively.

As can be seen from FIG. 7, in the case of the samples 2 and 3, when the mask misalignment distance is 0, i.e., when the edge of the second drain region resist pattern 26 is aligned with the edge of the LOCOS oxide film resist pattern 32a, the drain saturation current is maximized. In the case of the sample 1, when the mask misalignment distance is 0, the drain saturation current is close to the maximum value.

As shown in FIG. 10, when the acceleration energy in the ion implantation for the second drain region 6 is 50 KeV, the source side end of the P-type second drain region 6 is formed near the gate oxide film 12. On the other hand, as shown in FIG. 9, when the acceleration energy in the ion implantation for the second drain region 6 is 100 KeV, the source side end of the P-type second drain region 6 is sufficiently separated from the gate oxide film 12. Therefore, the acceleration energy in the ion implantation for the second drain region 6 is preferably 100 KeV or higher. Thus, lowering of the drain breakdown voltage due to concentration of the electric field in the vicinity of the gate electrode 14 is prevented.

Figure 11:
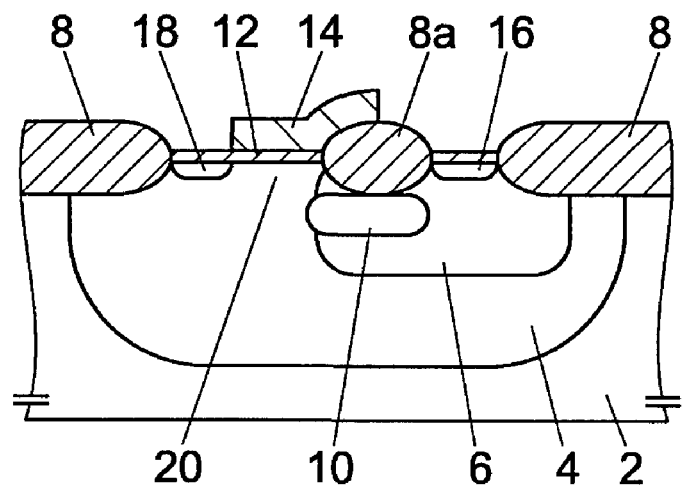
FIG. 11 is a schematic cross-sectional view showing a semiconductor device according to another embodiment.

FIG. 11 is a schematic cross-sectional view showing a semiconductor device according to another embodiment. Elements corresponding to those in FIG. 1 are denoted by the same reference numbers, and are not further described.

This embodiment is different from the embodiment shown in FIG. 1 in that a side surface of the P-type third drain region 10 at the channel region 20 side is not covered with the P-type second drain region 6. This configuration can be formed by changing the area of the opening of the resist pattern 34 used in the step shown in FIG. 5B. Even with this configuration, the same effects as in the embodiment shown in FIG. 1 can be achieved.

Figure 12:
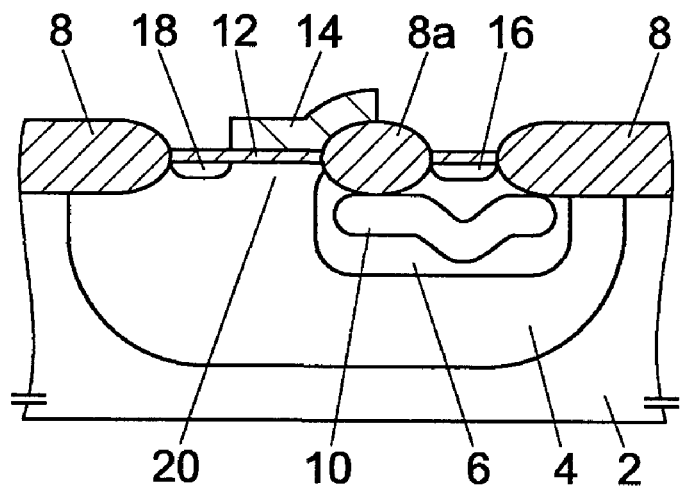
FIG. 12 is a schematic cross-sectional view showing a semiconductor device according to still another embodiment.

FIG. 12 is a schematic cross-sectional view showing a semiconductor device according to still another embodiment. Elements corresponding to those in FIG. 1 are denoted by the same reference numbers, and are not further described.

This embodiment is different from the embodiment shown in FIG. 1 in that the P-type third drain region 10 is formed to extend from a region under the LOCOS oxide film 8a to a region under the P-type first drain region 16. This configuration can be formed by changing the area of the opening of the resist pattern 34 used in the step shown in FIG. 5B. Even with this configuration, the same effects as in the embodiment shown in FIG. 1 can be achieved.

However, since the P-type third drain region 10 is formed using the LOCOS oxide films 8 and 8a as implantation masks, the P-type third drain region 10 under the P-type first drain region 16 is recessed. Thus, the punch through breakdown voltage between the P-type third drain region 10 and the P-type semiconductor substrate 2 is reduced. It is therefore preferable to form the P-type third drain region 10 only in the region under the LOCOS oxide film 8a as in the embodiment shown in FIG. 1.

Figure 13:
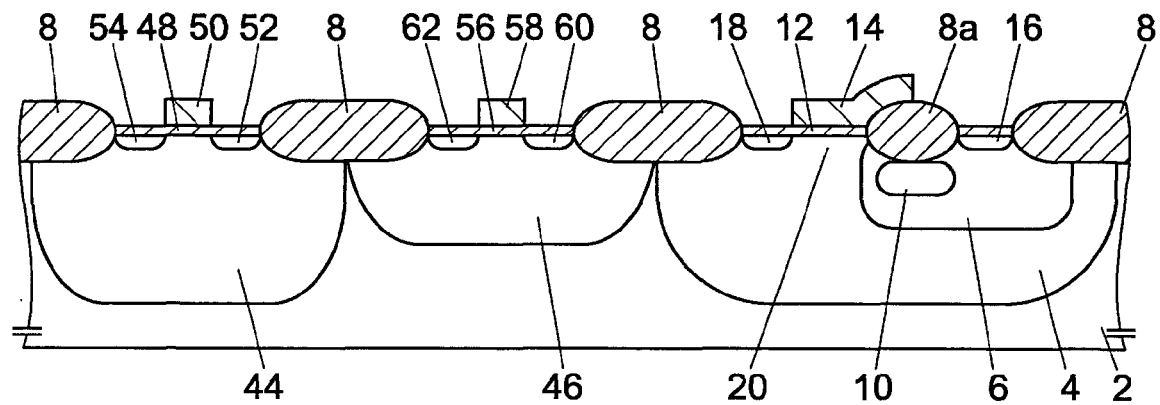
FIG. 13 is a schematic cross-sectional view showing a semiconductor device according to a further embodiment.

While only the region of the high breakdown voltage MOSFET is illustrated in the above embodiments, transistors for a logic circuit operable at high speed and low voltage may be formed in a region different from the region of the high breakdown voltage MOSFET as shown in FIG. 13.

FIG. 13 is a schematic cross-sectional view showing a semiconductor device according to a further embodiment. Elements corresponding to those in FIG. 1 are denoted by the same reference numbers. The configuration of the high breakdown voltage MOSFET is the same as that of FIG. 1, and is not further described.

An N-type well region 44 for a P-channel MOSFET and a P-type well region 46 for an N-channel MOSFET are formed in regions different from the region of the high breakdown voltage MOSFET on the P-type semiconductor substrate 2.

A gate oxide film 48, a gate electrode 50, a P-type drain region 52, and a P-type source region 54 are formed in the region where the N-type well region 44 is formed, thus forming the P-channel MOSFET.

A gate oxide film 56, a gate electrode 58, an N-type drain region 60, and an N-type source region 62 are formed in the region where the P-type well region 46 is formed, thus forming the N-channel MOSFET.

In this manner, the MOSFETs for the logic circuit operable at high speed and low voltage and the high breakdown voltage MOSFET can be integrated on one chip at low cost.

The conductivity type of each of the semiconductor substrate 2, well region, drain region, and source region in the above embodiments is merely an example, and this disclosure is not limited thereto. Each of these elements may alternatively be of the opposite conductivity type.

The conditions of the ion implantation, such as type of the implanted ion, the dose, and the implantation energy, described in the above embodiments are not intended to limit this disclosure, but are merely illustrative of the preferred embodiments of this disclosure.

The MOSFET of the semiconductor device of this disclosure may be applicable to, for example, semiconductor devices having analog circuits.

Figure 14:
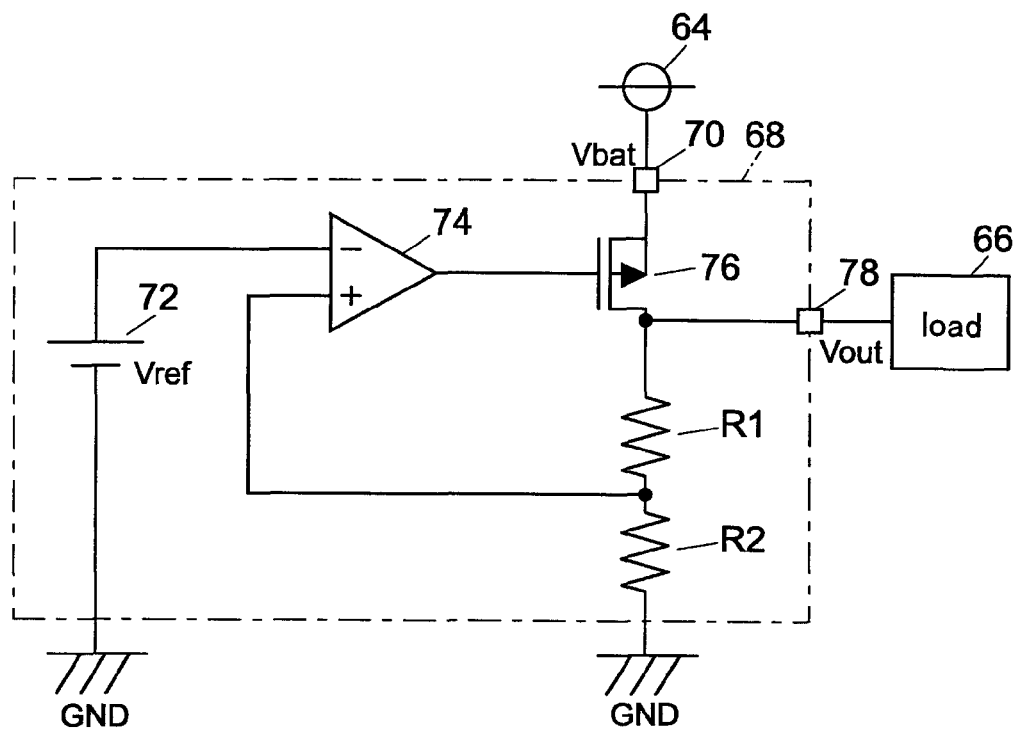
FIG. 14 is a circuit diagram illustrating a semiconductor device having a constant voltage generator circuit, which is an analog circuit, according to one embodiment.
Figure 15:
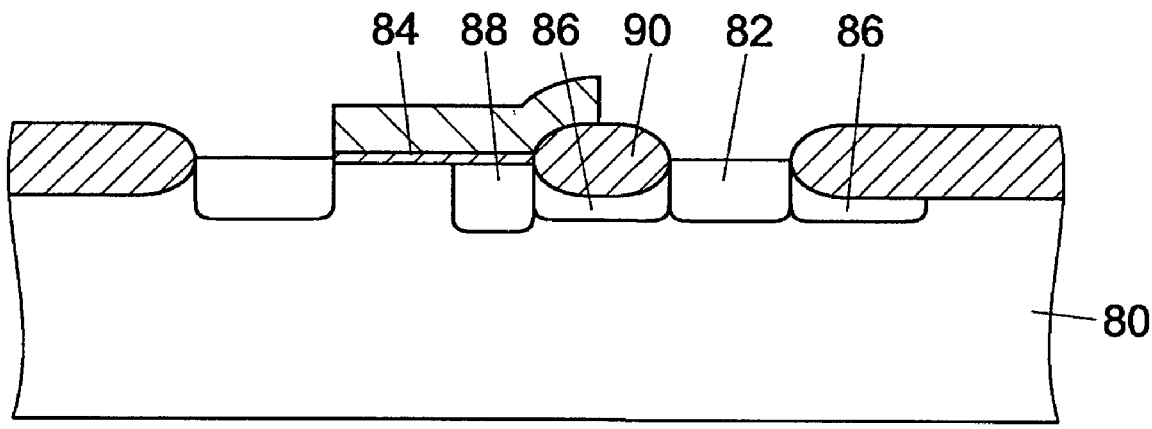
FIG. 15 is a cross-sectional view illustrating a related art semiconductor device.
Figure 16:
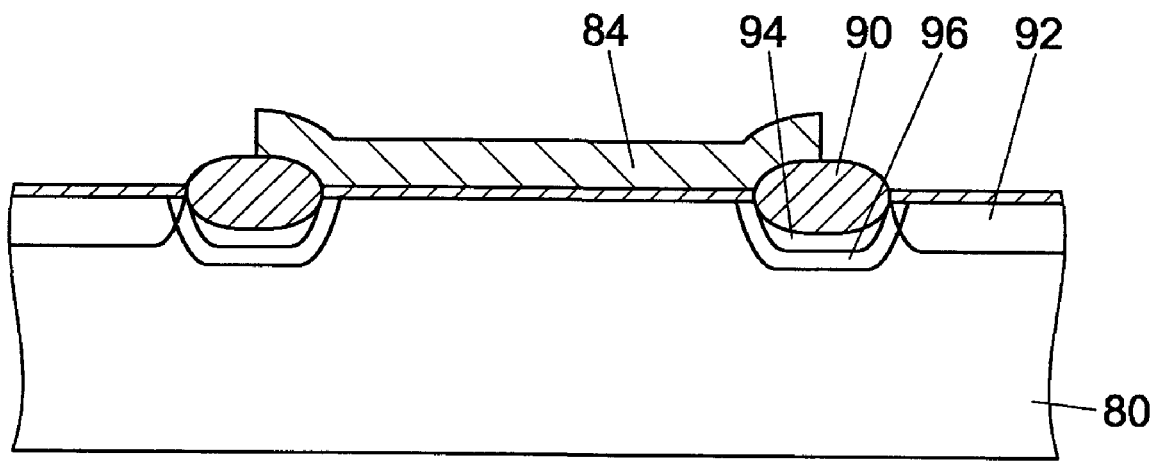
FIG. 16 is a cross-sectional view illustrating another related art semiconductor device.

FIG. 14 is a circuit diagram illustrating a semiconductor device having a constant voltage generator circuit 68, which is an analog circuit, according to one embodiment.

The constant voltage generator circuit 68 is provided in order to ensure stable power supply from a DC power source 64 to a load 66.

The constant voltage generator circuit 68 is provided in order to ensure stable power supply from a DC power source 64 to a load 66. The constant voltage generator circuit 68 comprises an input terminal (Vbat) 70 connected to the DC power source 64, a reference voltage generator circuit (Vref) 72, an operating amplifier (comparator circuit) 74, an output driver 76 including a MOSFET with low on resistance and high breakdown voltage, dividing resistor elements R1 and R2, and an output terminal (Vout) 78. The MOSFET of the output driver 76 is any one of the high breakdown voltage MOSFETs of the semiconductor devices described in the above embodiments of this disclosure.

The operating amplifier 74 of the constant voltage generator circuit 68 includes an output terminal connected to a gate electrode of the output driver 76, an inverting input terminal (−) to which a reference voltage is applied from the reference voltage generator circuit 72, and a non-inverting input terminal (+) to which an output voltage Vout divided by the resistance elements R1 and R2 is applied. The dividing resistor elements R1 and R2 divide the output voltage Vout to obtain a voltage equal to the reference voltage Vref.

This disclosure is applicable not only to semiconductor devices having constant voltage generator circuits but also to semiconductor devices having high breakdown voltage MOSFETs.

While this disclosure has been described in terms of the presently preferred embodiments, this disclosure is not limited to these embodiments. It will be apparent to those skilled in the art that various changes may be made in the size, shape, materials and arrangement of parts without departing from the scope of the invention as set forth in the accompanying claims.

The present application is based on Japanese Priority Application No. 2005-056850 filed on Mar. 2, 2005, with the Japanese Patent Office, the entire contents of which are hereby incorporated by reference.

What is claimed is:

1. A method for manufacturing a semiconductor device, comprising:
    a step of forming a well region of a first conductivity type in a semiconductor substrate;
    a step of forming a second drain region by ion-implanting impurities of a second conductivity type into a predetermined region of the well region;
    a step of forming a LOCOS oxide film at least in a predetermined region of a surface of the second drain region;
    a step of forming a third drain region covered with the second drain region at least at a lower part thereof by ion-implanting impurities of the second conductivity type into a region including a region under the LOCOS oxide film wherein at least some of the impurities are injected through the LOCOS oxide film in the step of forming the third drain region;
    a step of forming gate insulation film adjacent to the LOCOS oxide film on a surface of the well region;
    a step of forming a gate electrode across the gate insulation film and the LOCOS oxide film; and
    a step of forming a source region and a first drain region in the well region and the second drain region, respectively, by ion-implanting impurities of the second conductivity type while using the gate electrode and the LOCOS oxide film as masks.

2. The method as claimed in claim 1, wherein a plan position of an edge of a second drain region resist pattern used in the step of forming the second drain region for defining an end of the second drain region at a source region side is aligned with a plan position of an edge of the LOCOS oxide film resist pattern used in the step of forming the LOCOS oxide film for defining an end of the LOCOS oxide film at a source region side.

3. The method as claimed in claim 1, wherein the ion implantation is performed at an accelerated energy of 100 KeV or higher in the step of forming the second drain region.

4. The method as claimed in claim 1, wherein the third drain region is completely covered with the second drain region.

5. The method as claimed in claim 1, wherein the first drain region is covered with the second drain region.

6. The method as claimed in claim 1, wherein the third drain region is formed so that its side surface at a channel region side is not covered with the second drain region.

7. The method as claimed in claim 1, wherein the third drain region is formed only in the region under the LOCOS oxide film.

8. The method as claimed in claim 1, wherein the second drain region and the third drain region are spaced apart from the gate insulation film.

9. The method as claimed in claim 1, wherein the first conductivity type is P-type and the second conductivity type is N-type.

10. The method as claimed in claim 1, wherein the first conductivity type is N-type and the second conductivity type is P-type.

11. The method as claimed in claim 1, wherein the first drain region has a higher concentration of impurities than the third drain region, and the third drain region has a higher concentration of impurities than the second drain region.

* * * * *